United States Patent [19]
Bendz et al.

[11] 4,078,102
[45] Mar. 7, 1978

[54] PROCESS FOR STRIPPING RESIST LAYERS FROM SUBSTRATES

[75] Inventors: Diana Jean Bendz; Gerald Andrei Bendz, both of Vestal, N.Y.

[73] Assignee: International Business Machines Corporation, Armonk, N.Y.

[21] Appl. No.: 736,971

[22] Filed: Oct. 29, 1976

[51] Int. Cl.² .................. B44D 1/44; B08B 7/00; C23D 17/00
[52] U.S. Cl. .................. 427/341; 96/35.1; 134/38; 156/626; 156/668; 252/79.5; 252/364; 427/259; 427/272; 427/273
[58] Field of Search .............. 427/259, 341, 272, 273; 96/35.1; 134/38; 156/626, 668; 252/79.5, 364

[56] References Cited
U.S. PATENT DOCUMENTS

| | | |
|---|---|---|
| 3,625,763 | 12/1971 | Melillo .................. 134/38 |
| 3,813,309 | 5/1974 | Bakos et al. .................. 156/668 |
| 3,871,929 | 3/1975 | Schevey et al. .................. 156/668 |
| 3,930,857 | 1/1976 | Bendz et al. .................. 427/259 X |
| 3,980,587 | 9/1976 | Sullivan .................. 134/38 X |
| 3,988,256 | 10/1976 | Vandermey et al. .................. 134/38 X |

OTHER PUBLICATIONS

IBM Technical Disclosure Bulletin, *Photo Resist Stripper,* vol. 16, No. 6, Nov., 1973, p. 1917.

*Primary Examiner*—Michael R. Lusignan
*Attorney, Agent, or Firm*—David M. Bunnell

[57] ABSTRACT

Organic polymer resist layers are stripped from substrates by treating the layers with a mixture of an aldehyde or a ketone and an alcoholic solution of a compound selected from the group consisting of ammonium, alkali metal, and alkaline earth metal hydroxides and carbonates.

10 Claims, 1 Drawing Figure

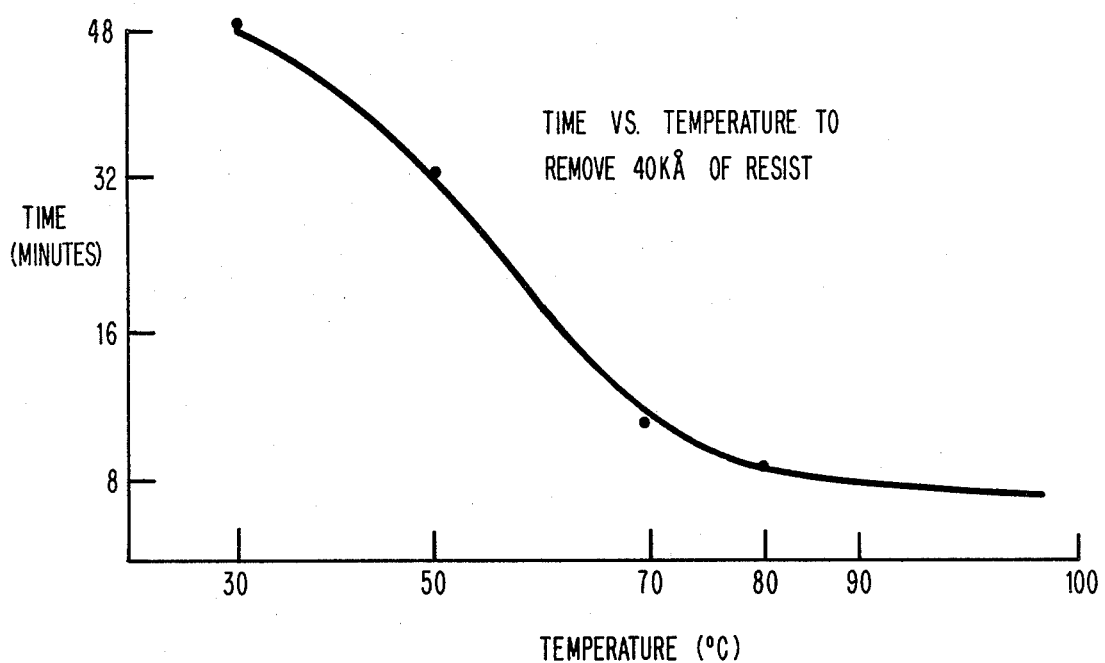

PROCESS FOR STRIPPING RESIST LAYERS FROM SUBSTRATES

The purpose of this abstract is to enable the public and the Patent and Trademark Office to rapidly determine the subject matter of the application. This abstract is neither intended to define the invention of the application nor is it intended to be limiting as to the scope thereof.

BACKGROUND OF THE INVENTION

Resist materials are used in the formation of printed circuits, exposure masks and micro electronic devices. The resists are light or high energy radiation sensitive organic polymer materials which form an image pattern upon exposure and development. Negative resists become insolubilized or cross-linked in the exposed areas so that development removes the unexposed portions of the resist layer. Positive resists, on the other hand, are degraded in the energy struck areas so that the exposed portions are removed by the developer and the unexposed resist remains. The resist pattern is resistant to various physical and chemical processes so that the substrate, upon which it is formed, is protected in the areas which are masked by the resist.

The final step in the resist process, after the pattern has fulfilled its masking function, is resist removal or stripping. Because the resist layers are often post hardened to improve their masking characteristics and their adherence to the substrate, or are hardened by the process to which the substrate is subjected, the removal of the resist without leaving a residue, is sometimes difficult. Methods which have been used to strip resist layers include abrasion, plasma ashing in oxygen, and solvent and/or chemical action. The first two methods can be detrimental to certain substrates, such as thin layer metallurgy, by abrading or oxidizing them. Commonly used solvent or chemical strippers may also chemically degrade the substrate and/or may be difficult to completely remove from the substrate following the stripping process. Some of the stripping solutions contain halogenated hydrocarbons or phenols. These materials are unsatisfactory for certain applications in that free halogens which are released by the halogenated hydrocarbons will attack metals such as copper, nickel and iron so that the presence of stripper residues, which are entraped on the substrate, can cause latent attack and reliability problems. Both halogenated hydrocarbons and phenols present handling and disposal problems from an environmental standpoint.

A stripping process has now been found which employs a stripping solution which is halogen free, which can remove either positive or negative resist layers, and which requires only an alcohol or water rinse to completely remove the solution from the substrate.

BRIEF SUMMARY OF THE INVENTION

In accordance with this invention there is provided a process for removing an organic polymer resist layer from a substrate comprising treating the layer with a mixture consisting essentially of an alcoholic solution of an activator compound selected from the group consisting of ammonium, alkali metal, and alkaline earth metal hydroxides and carbonates and an aldehyde or ketone in proportions to provide between about 0.005 mole to 0.1 mole of compound per mole of aldehyde or ketone.

DESCRIPTION OF THE DRAWING

The FIGURE is a graph showing the dependence of stripping time on temperature for an embodiment of the stripping process of the invention.

DETAILED DESCRIPTION

The process of the invention is suitable for stripping both negative and positive resist layers including those which have been postbaked. Examples of typical negative resists which are removed by the process of the invention are sensitized vinyl cinnamate polymers and partially cyclized poly-cis-isoprene polymers. Examples of positive resists which can be removed are diazo ketone sensitized phenol formaldehyde resins, polymethyl methacrylate polymers and copolymers and polysulfone polymers.

The stripping solutions are prepared using saturated alcoholic solutions of a compound such as a strong inorganic base which will activate the aldehyde or ketone so that it rapidly attacks the organic polymer resist layer. It is believed that the activator compound serves to ionize the carbonyl group to a carbanion which attacks the polymer, for example:

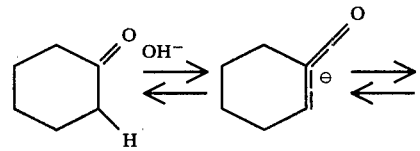

CYCLOHEXANONE   CARBANION

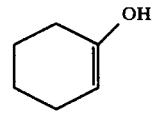

CYCLOHEXENOL

Too much of the activator compound favors the conversion of the carbanion to the enol which results in deactivation of the solution in a relatively short time. The activator should therefore be used in small amounts of about 0.005 to about 0.1 mole per mole of carbonyl compound with a preferred range of about 0.006 to 0.01 mole. These concentrations achieve a high rate of resist attack with a pot life of greater than 8 hours. For example, a saturated sodium hydroxide solution in isopropanol mixed with cyclohexanone in a proportion of 0.0065 moles of base per mole of ketone was successfully used for 5 consecutive days.

Suitable activator compounds are compounds selected from the group consisting of ammonium, alkali metal, and alkaline earth metal hydroxides and carbonates, for example, sodium, potassium, ammonium and calcium hydroxides and carbonates and tetramethyl ammonium hydroxide.

Suitable ketones include, for example, ethyl ketone, methyl ethyl ketone, methyl isopropyl ketone, benzyol methyl ketone, acetophenone, cyclohexanone, and methyl isobutyl ketone. Suitable aldehydes are aromatic aldehydes including, for example, benzaldehyde, tolualdehyde, nitrobenzaldehyde, salicylaldehyde, and phenylacetaldehyde. The aldehydes and ketones are selected to be sufficiently polar so that they are miscible with alcohol and yet are good solvents for the organic polymer resist residues which are to be removed from the substrate.

Suitable alcohols are, for example, alcohols containing 1 to 4 carbon atoms including, for example, methyl, ethyl, n-propyl, isopropyl, t-butyl, and allyl alcohol.

In preparing the solutions, the activator compound is dissolved in a small amount of alcohol to form a saturated solution and mixed with the carbonyl compound in volume ratios of about 1 percent: 99 percent to 50 percent: 50 percent alcohol: carbonyl.

The stripping speed is increased by heating the solutions to elevated temperatures. The stripping temperatures depend on the boiling and flash points of the stripping solutions. Temperatures of about 30° to 100° C are preferred.

The invention is further illustrated by, but is not intended to be limited to the following examples:

EXAMPLE 1

A stripping solution is prepared by mixing 2 liters of a saturated solution of sodium hydroxide in isopropanol, containing about 75 grams of sodium hydroxide, with 30 liters of cyclohexanone. The solution is used in stripping both positive and negative resist layers from metallized (chrome-copper-chrome) ceramic substrates at a solution temperature of 80° C in 5 to 8 minutes using ultrasonic agitation. A 30 second dip in isopropyl alcohol is used to rinse the substrates and no attack on the metal is observed. The pot life of the stripping solution is more than 8 hours and the shelf life, once mixed, is greater than 2 weeks.

The negative resist layers which were stripped were about 40,000 angstroms thick layers of light sensitized vinyl cinnamate polymers (Kodak KPR resists) and partially cyclized poly-cis-isoprene polymers (Kodak KTFR and KMER resists) which were patternwise exposed to actinic radiation, developed, and postbaked at about 140° C for 30 minutes. Stripping time for these resist layers was about 8 minutes at 80° C.

The positive resist layers were about 25,000 angstrom thick layers of an orthoquinone diazide sensitized novolak resin resist (Shipley AZ1350 resist) which were the unexposed portions of the resist remaining after light exposure and development. These resist layers were also postbaked at about 140° C for 30 minutes. Stripping times for the positive resist layers were about 5 minutes at 80° C. The figure shows the temperature dependence of the stripping rate for a 40,000 angstrom thick layer of Kodak KTFR resist.

EXAMPLE 2

The process of Example 1 was repeated except that the stripping solution is prepared by mixing two liters of a saturated sodium hydroxide solution in isopropanol (containing about 75 grams of sodium hydroxide), with 20 liters of methyl isobutyl ketone. The stripping solution was used to remove exposed Kodak KPR, KTFR, and KMER resist layers having a thickness of about 40,000 angstroms which had been postbaked at a temperature of 140° C for 30 minutes. The stripping time at 80° C was about 10 minutes, the substrates were rinsed following stripping by a 30 second dip in isopropyl alcohol.

EXAMPLE 3

A stripping solution was prepared as in Example 1 except that a 1 liter saturated methanol solution containing 100 grams of NaOH was mixed with 30 liters of cyclohexanone. The solutions completely stripped both negative and positive resists in about 5 minutes at a temperature of 80° C.

Stripping solutions using potassium hydroxide and tetramethyl ammonium hydroxide were also successfully employed to remove resist layers.

EXAMPLE 4

A stripping solution was prepared by mixing 1 liter of saturated MeOH solution of NaOH with 30 liters of benzaldehyde.

At 70° C negative resist strips in 2-3 minutes and positive resist strips in 1 minute.

EXAMPLE 5

In order to illustrate what occurs when a ketone without any base is used to try to strip a resist layer, a negative resist layer was placed in cyclohexanone. After 72 hours of exposure at 70°–80° C, no visible change to the negative resist layer occurred.

The foregoing has described a stripping process which employs a solution containing no halogenated hydrocarbon, which is capable of removing positive and negative resists, and which requires only an alcohol or water rinse following the stripping procedure to give a residue-free substrate surface. Because the stripping solution contains no oxidizing agents or halogens, the solution does not attack metallurgy such as chromium conductor lines formed on ceramic substrates. The solutions are relatively inexpensive, safe to use, and employ no highly toxic phenolic or hot acid compositions.

Although the invention has been particularly shown and described with reference to preferred embodiments thereof, it will be understood by those skilled in the art that the foregoing and other changes in form and details may be made therein without departing from the spirit and scope of the invention.

We claim:

1. A process for removing an organic polymer resist layer from a substrate comprising treating the layer with a mixture consisting essentially of an alcoholic solution of an activator compound selected from the group consisting of ammonium, alkali metal, and alkaline earth metal hydroxides and carbonates and an aldehyde or ketone in proportions to provide between about 0.005 mole to 0.1 mole of activator compound per mole of aldehyde or ketone so as to remove said resist layer from said substrate.

2. The process of claim 1 wherein the process is carried out at a temperature of from about 30° to 100° C.

3. The process of claim 1 wherein the activator compound is a strong inorganic base.

4. The process of claim 3 wherein the base is sodium hydroxide.

5. The process of claim 1 wherein the mixture includes an aldehyde.

6. The process of claim 1 wherein the mixture includes a ketone.

7. The process of claim 6 wherein the ketone is cyclohexanone.

8. The process of claim 1 wherein the alcoholic solution of the activator compound is a saturated solution in an alcohol which contains 1 to 4 carbon atoms.

9. The process of claim 1 wherein the proportions provide between about 0.006 mole to 0.01 mole of activator compound per mole of aldehyde or ketone.

10. A process for removing an organic polymer resist layer from a substrate having a pattern of metal conductor lines formed on its surface comprising treating the layer with a mixture consisting essentially of a saturated isopropyl alcohol solution of sodium hydroxide and cyclohexanone, in proportions to provide between about 0.006 mole to 0.01 mole of activator compound per mole of aldehyde or ketone, at a temperature of about 80° C with agitation so as to remove said resist layer from said substrate.

* * * * *